United States Patent [19]

Kojima et al.

[11] Patent Number: 5,455,382
[45] Date of Patent: Oct. 3, 1995

[54] IC PACKAGE HEAT SINK FIN

[75] Inventors: Masayasu Kojima; Chihiro Hayashi, both of Takarazuka, Japan

[73] Assignee: Sumitomo Metal Industries, Ltd., Osaka, Japan

[21] Appl. No.: 335,952

[22] Filed: Nov. 3, 1994

Related U.S. Application Data

[63] Continuation-in-part of Ser. No. 968,359, Oct. 29, 1992, abandoned.

[30] Foreign Application Priority Data

Oct. 31, 1991 [JP] Japan .................. 3-286769

[51] Int. Cl.[6] .................. H01L 23/367; H01L 23/373
[52] U.S. Cl. .................. 174/16.3; 165/80.3; 257/722; 361/709
[58] Field of Search .................. 174/15.1, 16.1, 174/16.3; 165/80.2, 80.3, 80.4, 185; 257/712–714, 718–722; 361/690, 697, 702, 703, 704, 709, 710, 716, 717, 718; 439/487, 932

[56] References Cited

U.S. PATENT DOCUMENTS

| | | | |
|---|---|---|---|
| 3,180,404 | 4/1965 | Nelson et al. | 174/16.3 X |
| 3,961,666 | 8/1978 | Suzuki et al. | 165/80.3 X |
| 4,296,455 | 10/1981 | Leaycraft et al. | 174/16.3 X |
| 4,459,638 | 7/1984 | Brehm et al. | 361/690 X |
| 4,694,378 | 9/1987 | Nakayama et al. | 165/80.4 X |
| 4,698,663 | 10/1987 | Sugimoto et al. | 361/386 X |
| 4,823,869 | 4/1989 | Arnold et al. | 174/16.3 X |
| 4,879,891 | 11/1989 | Hinshaw | 165/80.3 X |
| 4,884,331 | 12/1989 | Hinshaw | 361/704 X |
| 4,884,631 | 12/1989 | Rippel | 165/185 |
| 4,899,210 | 2/1990 | Lorenzetti et al. | 257/712 |
| 5,003,429 | 3/1991 | Baker et al. | 165/185 X |
| 5,083,194 | 1/1992 | Bartilson | 257/722 |
| 5,155,579 | 10/1992 | AuYeung | 174/16.3 X |

FOREIGN PATENT DOCUMENTS

| | | | |
|---|---|---|---|
| 0029501A2 | 6/1981 | European Pat. Off. | 174/16.3 |
| 0253126 | 1/1988 | European Pat. Off. | |
| 542478 | 5/1993 | European Pat. Off. | 257/722 |
| 540420 | 5/1993 | European Pat. Off. | 257/722 |
| 56-198 | 1/1981 | Japan. | |
| 61-051931 | 3/1986 | Japan. | |
| 61-100361 | 5/1986 | Japan. | |
| 2204181 | 11/1988 | United Kingdom. | |
| 91/11024 | 7/1991 | WIPO. | |

OTHER PUBLICATIONS

"The Application of Two–Phase Push–Pull Cooling Module in Pin–fin array Electronic Device," Yu–Lin Chao and Fang–Lin Chao, (Eighth Annual IEEE Semi Conductor Thermal Measurement and Management Symposium, Feb. 3–5, 1992) pp. 97–100.

Electronics International, S. W. Fields, "Grooved Substrate Boosts IC Cooling"; vol. 55, No. 17, Aug. 1982, pp. 46–48.

*Primary Examiner*—Peter Dungba Vo
*Attorney, Agent, or Firm*—Burns, Doane, Swecker & Mathis

[57] ABSTRACT

A fin assembly for use as a heat sink and production thereof are disclosed. The fin assembly comprises a plurality of heat dissipating plates formed by means of a multi-wire saw, and the heat dissipating plates each has a thickness t of no more than 1 mm and being spaced apart by a gap g of no more than 1.5 mm the heat dissipating plates or pins having a height h, wherein the ratio h/t is not less than 20 and the ratio h/g is not less than 15 in one embodiment and 19 in another embodiment of the invention.

18 Claims, 10 Drawing Sheets

Fig. 10A
Fig. 10B
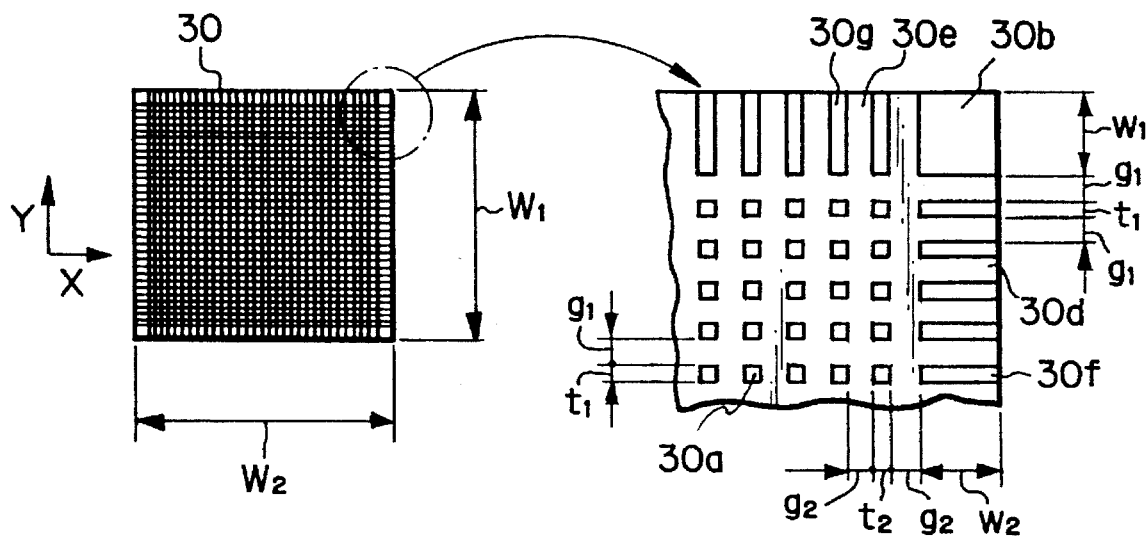
Fig. 10C
Fig. 10D
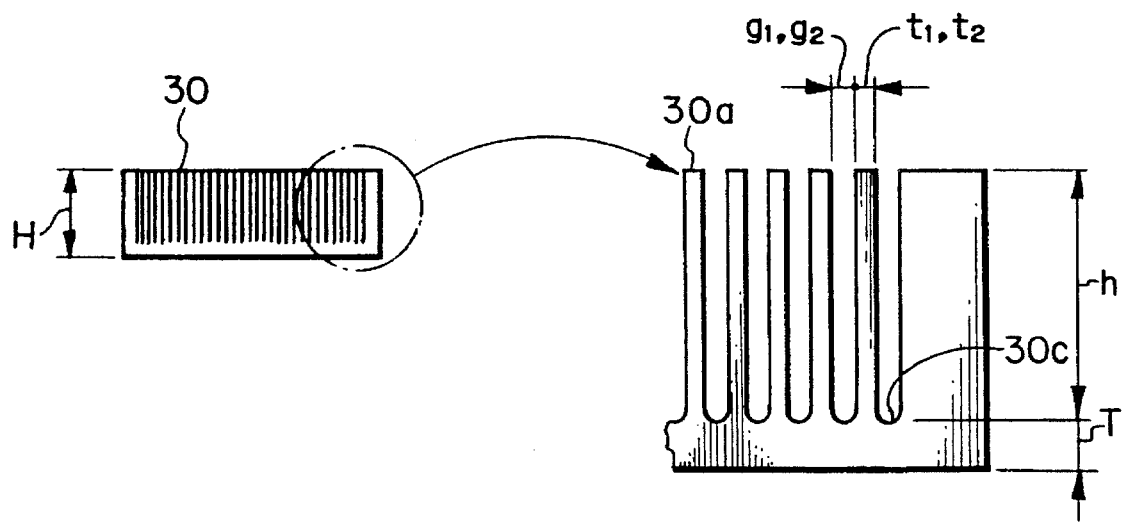

IC PACKAGE HEAT SINK FIN

This application is a continuation-in-part of Ser. No. 07/968,359, filed on Oct. 29,1992, now abandoned.

BACKGROUND OF THE INVENTION

The present invention relates to a heat fin assembly (hereunder sometimes referred to merely as a "fin" or "heat sink fin") for use as a heat sink and to a process for producing the heat sink fin. More particularly, the present invention relates to a heat sink fin produced by means of a multi-wire saw.

The heat sink fin according to the present invention can be used in various applications, but in particular it will be described as a heat sink for IC packages in which an IC chip is airtightly sealed.

FIGS. 1A and 1B are respectively a planar view and a cross-sectional view of a ceramic IC package, which is one type of IC package with which the present invention can be employed.

The IC chip generally indicated by 1 is placed within a airtight space 4 that is defined by a ceramic base 2 and a ceramic cap 3. The chip 1 is fixed in a central cavity of the base 2. The base 2 and the cap 3 are sealed together by means of a glass layer 6, with leads 5 being held in the glass layer 6. The leads are connected to the IC chip 1 via lead wires 7. In fabricating the package, the materials forming the base 2, cap 3, leads 5 and glass layer 6 are selected such that they will have generally the same coefficient of linear expansion, and the utmost care is exercised to insure reliability for the package.

As the integration of IC increases, a need has arisen to insure that the heat generated by the IC chip 1 is dissipated to the outside of the package. Otherwise, the heat would cause erroneous IC operations or the air-tightness of the package would be damaged to cause serious troubles. One possible way to avoid this problem is to make the base 2 in FIG. 1B of a good heat conductor. However, the ability of such a structure to dissipate heat is limited, since heat is dissipated only from the surface of the base 2.

Under the circumstances, there has been proposed an IC package of such a structure that heat generated from the IC can be efficiently released to the outside of the package.

FIG. 2 shows an example of this structure as applied to a ceramic package of a pin grid array type. An IC chip generally indicated by 1 is fixed at the center of a heat conducting plate 12 and placed within an airtight space 14 that is defined by frame-like ceramic plates 9 and 10 and a lid 13. The metallic lid 13 and the ceramic plate 9, as well as the heat conducting plate 12 and the ceramic plate 10, are joined together by a suitable method such as brazing, and the mating surfaces of the ceramic plates 9 and 10 are sealed together by means of a glass layer. Pins 11 inserted into the ceramic plate 9 are connected electrically to the circuit on the IC chip 1 via lead wires 7 and the conductive circuit drawn on the surface 10a of the ceramic plate 10.

The material forming the heat conducting plate 12 is selected from among those materials which have a high heat conductivity but which have a small difference in linear expansion coefficient from the chip 1, such as copper-impregnated tungsten or Kovar (trade name of Co—Ni—Fe alloy). A heat sink fin 8 is joined to the underside of the heat conducting plate 12.

The fin 8 is composed of both a bottom plate 8b to be mounted on the heat conducting plate 12 and a plurality of heat dissipating portions 8a. Heat generated from the IC chip 1 is transmitted through the heat conducting plate 12 to reach the bottom plate 8b and heat dissipating portions 8a, where it is dissipated from the fin surfaces 8d. To promote the dissipation of heat from the fin surfaces 8d, a cooling medium in either gaseous or liquid form is permitted to flow in the heat dissipating portions 8a. Thus, the fin 8 must satisfy certain conditions both as to heat conduction and heat transfer characteristics.

To improve the heat conduction characteristics of the heat sink fin 8, it is necessary that a material of high heat conductivity such as aluminum or copper be used and that the heat dissipating portions 8a have a large total cross-sectional area. To improve the heat transfer characteristics of the heat sink fin 8, it is necessary that the pressure loss when the cooling medium passes through the heat dissipating portions 8a be minimized and that the heat dissipating portions 8a have a large total surface area. With a view to meeting these requirements, heat sink fin of various shapes have heretofore been proposed.

FIGS. 3A and 3B show typical examples of a prior art fin.

FIG. 3A shows a channel-type fin 8', that has plate-shaped heat dissipating portions 8a' (hereunder referred to as "heat dissipating plates") arranged parallel to one another. This type of heat sink fin assembly is hereunder referred to as a "channel fin". FIG. 3B shows a pin-type fin 8" that has pin-shaped heat dissipating portions 8a" (hereunder referred to as "heat dissipating pins") erected in an array. This type of heat sink fin assembly is hereunder referred to as a "pin fin".

The difference between the two types of fins lies in the manner in which the cooling medium flows in the heat dissipating portions 8a' or 8a". In the channel fin of FIG. 3A, the cooling medium will flow in only one direction along the heat dissipating plates 8a', whereas the pin fin 8" of FIG. 3B enables the cooling medium to flow in every direction. Further, the presence of many surfaces on which the cooling medium will impinge contributes to promote cooling by virtue of what is generally referred to as the "boundary layer renewal effect".

The channel fin 8' is generally produced by either a plastic working method or by a machining method.

FIG. 4 is an illustration of a hot extrusion method used to manufacture the channel fin assembly 8' of FIG. 3A. A heated billet 16 is inserted in the container 15 and is pressed with a plunger 17 so that a long semifinished product 19 is extruded through a hole 20 of a die 18 that is of the same shape as the hatched area A of FIG. 3A. A prescribed length of the extrudate is cut off to produce the channel fin 8'. When producing the channel fin 8' by extrusion, the thickness t of and gaps g between heat dissipating plates 8a' shown in FIG. 3A are limited. The lower limit of the thickness t is said to be about 2 mm, below which working by extrusion becomes very difficult. The lower limit for the gaps g is said to be about 3 mm, below which the strength of die hole 20 cannot be insured. For the same reason, the height h of the heat dissipating plates 8a' is generally so set that it will not exceed about 5 times the gap g.

When producing the channel fin 8' by machining, milling is adopted. FIG. 5 illustrates how milling is performed. A predetermined number of milling cutters 21 are rotated over a workpiece 22 (a material block of the same outside dimensions as the channel fin assembly 8' to be produced) to cut grooves 23, which are made progressively deeper by continuing the revolution of milling cutters 21. The thickness t of and gaps g between the heat dissipating plates $8a'$ shown in FIG. 3A are also limited when producing the channel fin $8'$ by milling. The lower limit of the thickness t is said to be about 1.5 mm in order to prevent the walls defining each groove 23 from being fractured by the cutting force acting on the walls. The lower limit for practical purposes of the gaps g is said to be about 1.5 mm, below which the rigidity of milling cutters 21 cannot be insured. For the same reason, the height h of the heating dissipating plates $8a'$ is generally so set that it will not exceed about 10 times the gap g.

As discussed above, the channel fin $8'$ produced by the conventional plastic working or machining method has a large plate thickness t and gap g between heat dissipating plates $8a'$, and their height h is also limited. Hence, if one wants to assure the necessary surface and cross-sectional areas by providing a predetermined number of heat dissipating plates $8a'$, the planar dimensions $W_1 \times W_2$ of the channel fin $8'$ will inevitably increase.

There are a number of ways of producing the pin fin $8''$, including machining and die casting. However, all of these methods have such poor production efficiency that it is not economically feasible to adopt them in large-scale production. As an example, machining with a milling machine will be described below.

As shown in FIG. 5, the process starts by cutting shallow grooves in one direction in one surface of a workpiece 22. Then, the workpiece 22 is rotated 90° in the same plane and grooves are cut in such a direction that they cross the previously formed grooves at right angles. This procedure is repeated so that the depth of the grooves will increase progressively to eventually yield the pin fin $8''$ shown in FIG. 3B. The grooves are made progressively deeper in order to insure that the walls of grooves formed in the first stage of working will not be deformed by the cutting force of the milling cutters 21. The working method under discussion involves certain dimensional limitations due to the need to prevent deformation from occurring during the cutting operation. The lower limits on the thickness $d_1$ ($d_2$) of the heat dissipating pins $8a''$ and the gaps $g_1$ ($g_2$) therebetween are said to be about 2 mm and 2.5 mm, respectively, whereas the height h of the pins is generally so set that it will not exceed about 10 times the value of $g_1(g_2)$.

Thus, the pin fin assembly $8''$ produced by the machining method has large thicknesses $d_1$ ($d_2$) and gaps $g_1$ ($g_2$) and the height h is also limited. Hence, if one wants to assure the necessary surface and cross-sectional areas by providing a predetermined number of heat dissipating pins $8a''$, the planar dimensions $W_1 \times W_2$ of the pin fin $8''$ will inevitably increase.

Increasing the planar dimensions $W_1 \times W_2$ will naturally increase the size of the electronic device in which the package is installed. Hence, this is not a feasible approach.

SUMMARY OF THE INVENTION

In light of the ever increasing integration of IC chips, there is a need to improve the thermal-dissipation characteristics of a heat sink fin without increasing its size.

It is therefore an object of the present invention to provide a fin for use as a heat sink and a process for producing the same that is capable of increasing the area of heat dissipation remarkably while having limited planar dimensions so as to eliminate the limitations on the area of heat dissipation in the above-described prior art channel or pin fin.

In order to increase the area of heat dissipation without increasing the planar dimensions $W_1 \times W_2$ of a heat fin assembly (see FIGS. 3A, 3B), it is necessary that the thickness of heat dissipating plates on a channel fin or that of heat dissipating pins on a pin fin be minimized and that the gap between those plates or pins be narrowed within a range that will not increase the pressure loss.

Preferably, the height H of heat dissipating plates or pins (also see FIGS. 3A, 3B) should be as small as possible within a range that satisfies the requirements for thermal-dissipation capability so as to realize a compact heat sink fin.

The present inventors studied various methods that would be capable of meeting the above-mentioned requirements and found that heat dissipating plates or pins arranged close together could be best worked with a multi-wire saw which has heretofore been used exclusively in slicing brittle materials such as silicon into wafers.

The present invention provides a process for producing a fin for use as a heat sink that is a monolithic combination of a bottom plate for receiving heat from a heat conducting plate and a plurality of heat dissipating plates extending in parallel to one another from the bottom plate. The process comprises moving a wire along a plurality of rows as the wire is urged against a workpiece, the wire being stretched on the same pitch as the heat dissipating plates and with an abrasive slurry present between the wire and the workpiece, whereby a row of parallel grooves having a predetermined depth and width are formed in the surface of the workpiece under the grinding action of the abrasive powder contained in the abrasive slurry.

The present invention also provides a process for producing a fin for use as a heat sink that is a monolithic combination of a bottom plate for receiving heat from a heat conducting plate and a plurality of heat dissipating pins that are arranged to form an array in two directions (X,Y) in the plane of the bottom plate. The process comprises moving a wire along a plurality of rows as the wire is urged against a workpiece, the wire being stretched on the same pitch as the heat dissipating pins are arranged in the X-direction and with an abrasive slurry present between the wire and the workpiece, thereby providing a semifinished product in which a row of parallel grooves having a predetermined depth and width has been formed in the surface of the workpiece under the grinding action of the abrasive powder contained in the slurry, then moving a wire along a plurality of rows as the wire is urged against the semifinished product in such a way that the row of parallel grooves in the surface of said semifinished product will cross the wire, the wire being stretched on the same pitch as said heat dissipating pins are arranged in the Y-direction, whereby the row of parallel walls between said parallel grooves in the surface of said semifinished product are cut to a predetermined depth under the action of said abrasive powder.

If desired, the grinding operation in the X- and Y-directions may be performed in one step with a level difference being provided between the wires stretched in the X-direction and the wires stretched in the Y-direction.

The present invention further provides a fin for use as a heat sink that is a monolithic combination of a bottom plate and a plurality of heat dissipating plates arranged parallel to one another and extending from the bottom plate, the heat dissipating plates each having a thickness t of no more than 1 mm and being spaced apart by a gap g of no more than 1.5 mm. Preferably, this heat sink fin is produced by means of a multi-wire saw. The plates can have a height h of at least 3.0 mm, preferably at least 10.0 mm wherein h/t is not less than 20, preferably 30–50 and h/g is not less than 15, preferably 15–25.

According to one embodiment of the present invention, the heat dissipating plates at both ends of the heat fin assembly are thicker than the other heat dissipating plates positioned between the ends.

The present invention also provides a fin for use as a heat sink that is a monolithic combination of a bottom plate and a plurality of heat dissipating pins that are arranged in an array extending from the bottom plate. The heat dissipating pins each have a thickness t and planar dimensions of no more than 1 mm×1 mm and are spaced apart by a gap g of no more than 1.5 mm. Preferably, this heat sink fin is produced by means of a multi-wire saw. The pins can have a height h of at least 3.0 mm, preferably at least 10.0 mm wherein h/t is not less than 20, preferably 30–50 and h/g is not less than 15, preferably, 15–25.

According to one embodiment of the present invention, the heat dissipating pins at the four corners and/or on the four sides of the heat fin assembly are thicker than the other heat dissipating pins positioned between the corners and/or sides.

BRIEF DESCRIPTION OF THE DRAWINGS

FIG. 10A is a planar view illustrating a pin heat sink fin produced by the process of the present invention.

FIG. 10B is an enlarged view of a portion of FIG. 10A.

FIG. 10C is a Side view of the same fin assembly.

FIG. 10D is an enlarged view of a portion of FIG. 10C.

DESCRIPTION OF PREFERRED EMBODIMENTS

The processes for producing a heat sink fin according to the present invention will be described below with reference to the accompanying drawings. A heat sink fin for an IC package will be used as a representative of the present invention.

First, the multi-wire saw (hereunder referred to simply as a "wire saw") to be used in the present invention will be described.

Figure 6A:
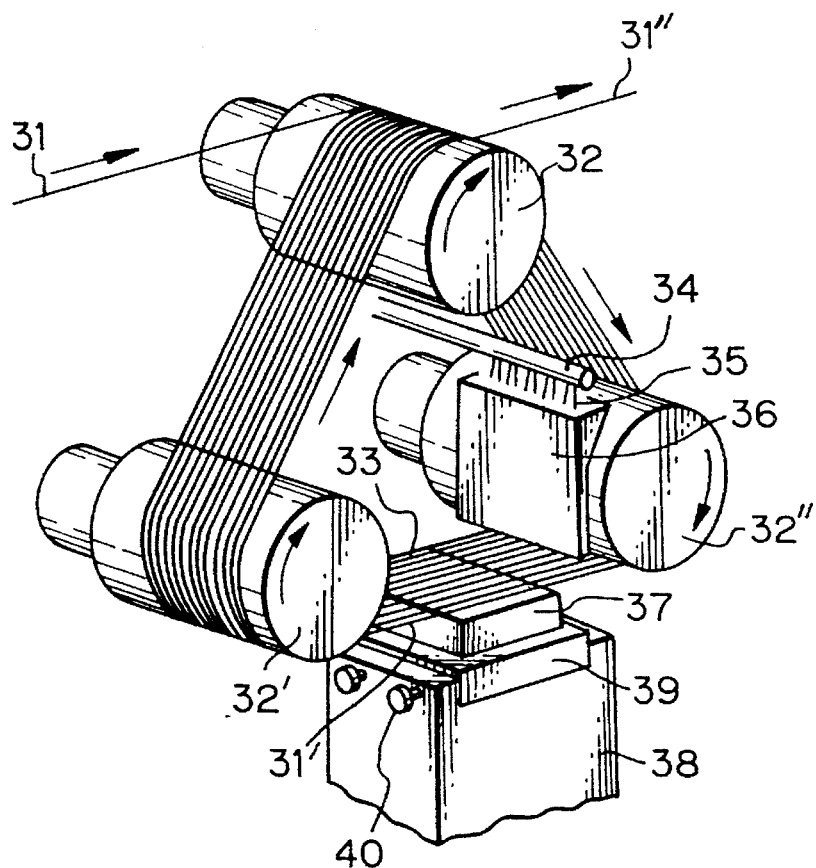
FIG. 6A is a simplified perspective view showing the working section of a multi-wire saw.
Figure 6B:
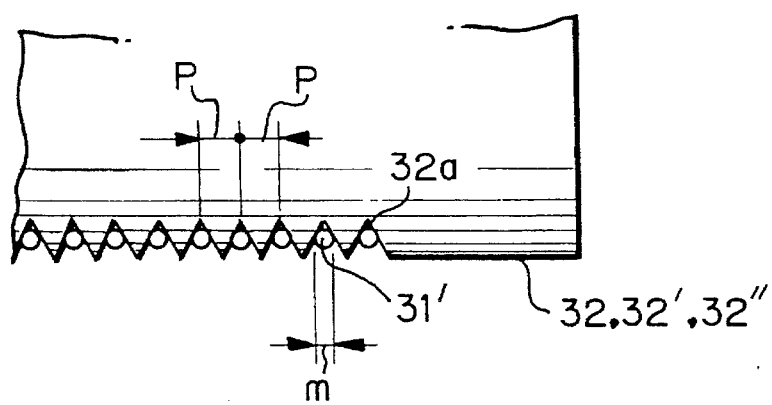
FIG. 6B is an enlarged view of a portion of FIG. 6A.

FIGS. 6A and 6B are a simplified perspective view and a simplified cross-sectional view, respectively, of an exemplary wire saw. Wire saws are classified as being of two general types, one being a reciprocating type described in Japanese Patent Publication No. 198/1981 and the other being a one-way traveling type described in Japanese Patent Public Disclosure No. 100361/1986. The wire saw shown in FIGS. 6A and 6B is of the one-way traveling type.

While either type of wire saw is applicable in the present invention, the following description is directed to the second type which has a higher working efficiency.

In FIG. 6A, a wire 31, such as a piano wire, is delivered from a feed unit (not shown) and wound onto grooved rollers 32, 32" and 32' to form a wire array 33 consisting of a predetermined number of rows spaced with a predetermined pitch. A wire 31" unwound from the grooved roller 32 and traveling to the right side of FIG. 6A is received by a takeup unit (not shown). The wire feed and takeup units are both equipped with a mechanism for applying a predetermined tension to the wire so that the wire is taut.

FIG. 6B shows in cross section how the wire 31' is wound onto each of the grooved rollers 32, 32' and 32". Each of the rollers has V-shaped annular grooves 32a machined in its surface with a predetermined pitch P and the intended wire pitch P is assured by fitting the wire 31' in each of the grooves 32a.

At least one of the grooved rollers 32, 32' and 32" is rotationally driven so that the wire travels along the wire array 33 in one direction. At the same time, an abrasive slurry 35 that has been supplied to a hopper 36 through a feed pipe 34 flows down to form a curtain on the wire array 33 as it is guided through slits provided below the hopper 36, whereby the abrasive slurry deposited on the wire array 33 is supplied to the areas of a workpiece 37 to be worked. The workpiece 37 is bonded or otherwise fixed to a base 39 that is secured to a table 38 by clamping with bolts 40. When the table 38 is elevated slowly so that the workpiece 37 is urged against the wire array 33, the grinding action of the abrasive powder contained in the abrasive slurry deposited on the wire array 33 scrapes off the surface of the workpiece 37 in areas against which the wire array 33 is urged. Since the abrasive powder used in the present invention is in a free state, it causes an extremely weak grinding force to act on the workpiece.

Figure 7A:
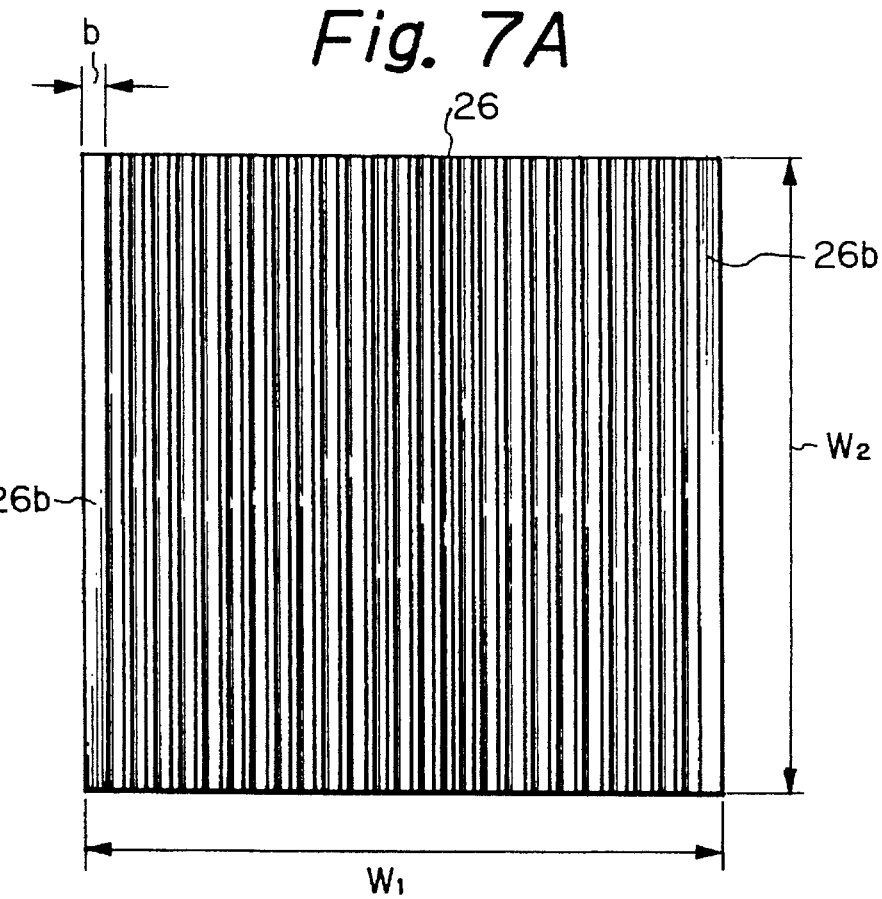
FIG. 7A is a planar view illustrating a channel heat sink fin produced by the process of the present invention.
Figure 7B:
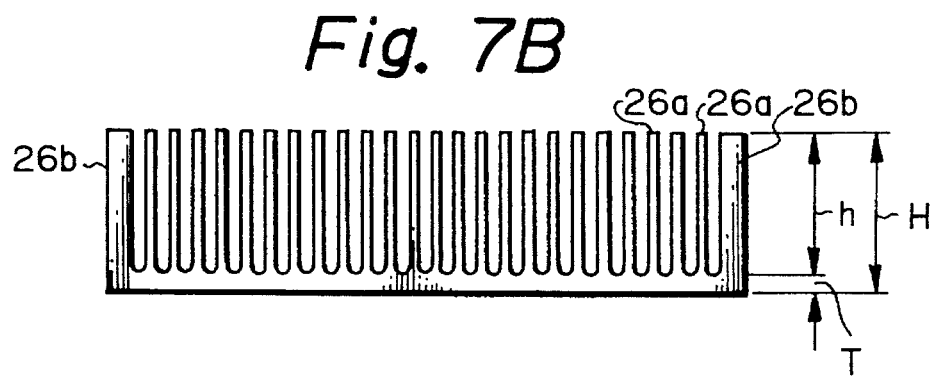
FIG. 7B is a cross-sectional view of the same fin assembly.
Figure 7C:
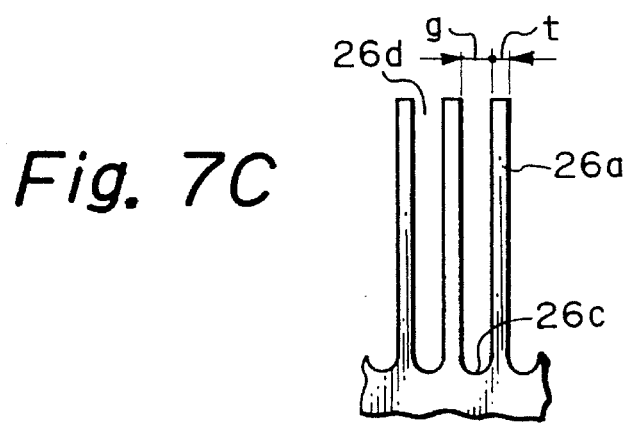
FIG. 7C is a cross section of a portion of the same fin assembly.

A method of forming channel fins by means of the wire saw outlined above will now be described. FIGS. 7A, 7B and 7C are a planar view, a side view, and an enlarged side view, respectively, of a channel heat sink fin 26 that is to be produced by working according to the present invention. As already mentioned, the channel heat sink fin 26 is characterized in that the thickness t of the heat dissipating plates 26a can be made much thinner than in the prior art. However, if t is extremely small, the heat dissipating plates 26a might occasionally bend during working. Therefore, from a practical stand point, the minimum value of t that is feasible is about 0.2 mm. If t is small, the heat dissipating plates 26a can potentially deform during handling of the channel heat sink fin 26. To avoid this problem, the heat dissipating plates 26b at both ends of the fin assembly are preferably made thicker than the other plates 26a positioned inward, as shown in FIGS. 7A and 7B. The thickness b of the heat dissipating plates 26b will suffice for practical purposes if it is in the range of from about 0.5 to about 1 mm. Needless to say, the thickness b of the heat dissipating plates 26b may be equal to the thickness t of the other heat dissipating plates 26a.

A block of material in the form of a rectangular prism that has the same outside dimensions as those of the channel fin assembly 26 ($W_1 \times W_2 \times H$) shown in FIGS. 7A, 7B is used as workpiece 37. It is set as shown in FIG. 6A and subjected to grinding with the wire saw until the depth of cuts has become equal to h shown in FIG. 7B, whereupon the lifting of the workpiece 37 is stopped.

Figure 8A:
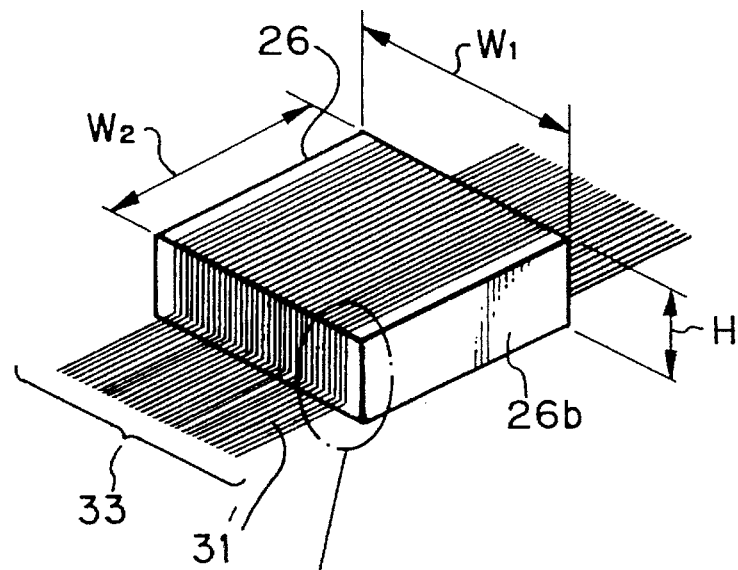
FIG. 8A is a perspective view illustrating the state of a workpiece after completion of working with a multi-wire saw.
Figure 8B:
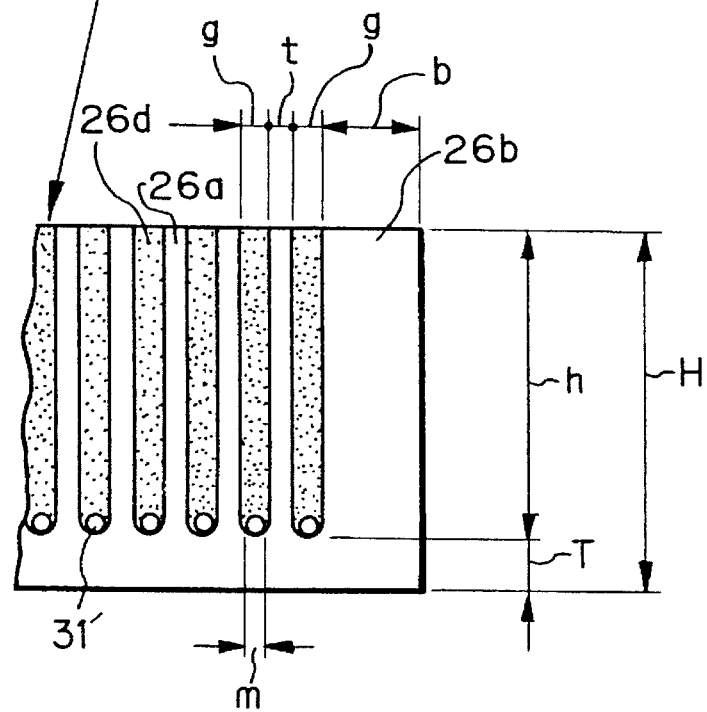
FIG. 8B is a cross section of a portion of FIG. 8A.

The state in which the cuts have reached the desired depth, is shown in FIGS. 8A and 8B, which are a perspective view and an enlarged cross-sectional view, respectively. The width g of each groove 26d that is formed by the action of wire 31' and the abrasive powder is approximately equal to (m+3q); i.e., g= m+3q (m: wire diameter; q: particle size of abrasive powder) and the gap g of heat dissipating plates 26a shown in FIG. 7A can be freely adjusted by changing the combination of wire diameter and particle size of abrasive powder. The wire 31' has a circular cross section, so the bottom of each groove 26c is semicircular in shape as shown in FIG. 7C. The depth h of each groove 26d can be freely set by changing the lifting stroke of the table 38 of the wire saw, so unlike the production process of the prior art, there are no limitations on the height of the heat dissipating plates 26a. An advantage of using the wire saw is that heat dissipating plates 26a can be worked to a small thickness. This is because the wire saw, which relies upon grinding with the free abrasive powder in the abrasive slurry, exerts an extremely weak working force on the heat dissipating plates 26a.

The channel heat sink fin 26 in the state shown in FIGS. 8A and 8B may be dismounted from the base 39 in the following manner. First, the table 38 is lowered while the wire is run (see FIG. 6A) so that the wire is pulled out of the grooves 26d in the channel fin 26. Subsequently, the abrasive slurry in the grooves 26d is flushed out by cleaning with kerosene, etc., and the bolts 40 are loosened so that the base 39 is detached from the table 38. Thereafter, the channel fin 26 is separated from the base 39.

Figure 9:
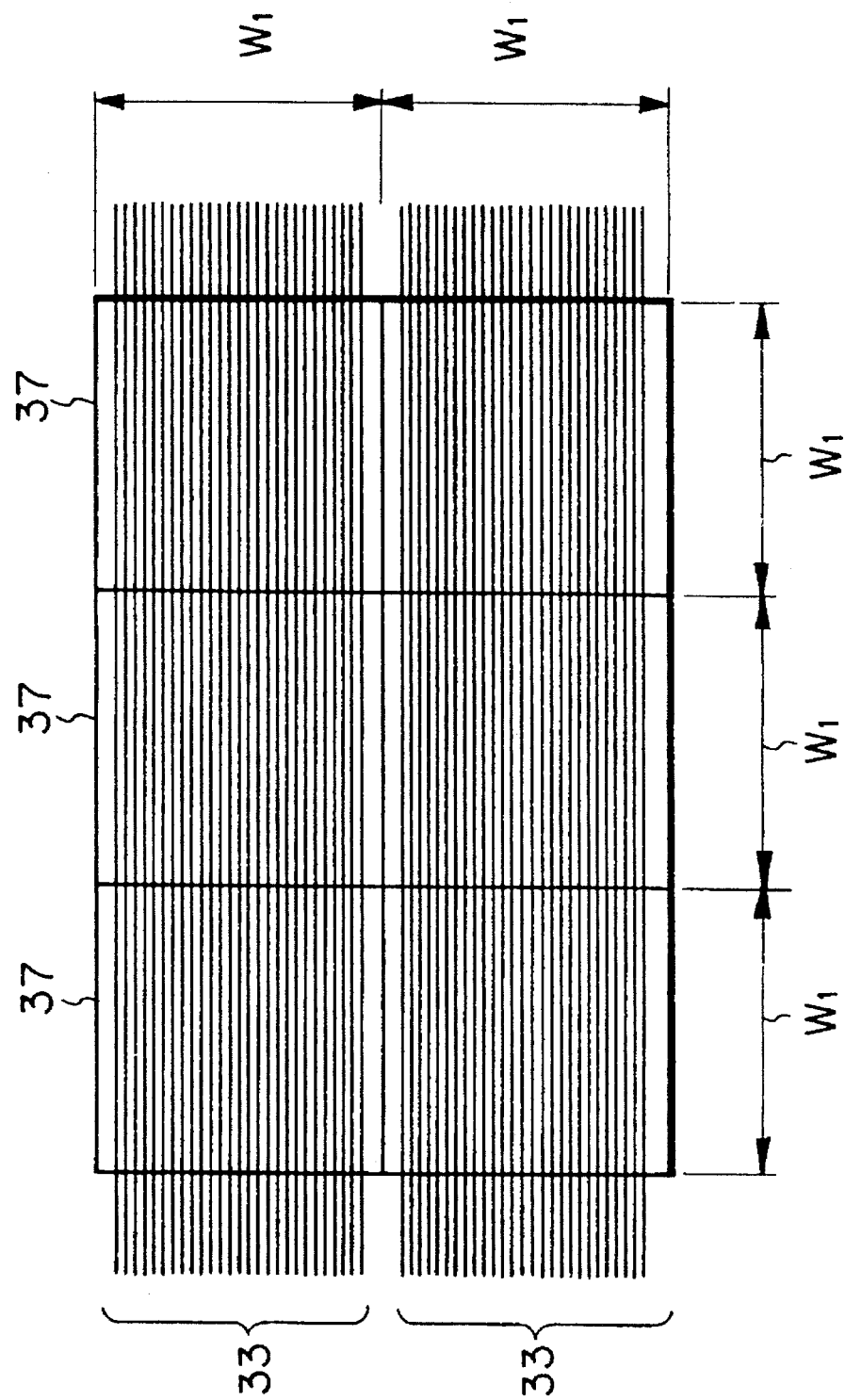
FIG. 9 is an illustration showing how wire rows in a wire saw are set on a plurality of workpieces.

While the foregoing description is directed to the case of working a single channel fin assembly, a plurality of workpieces 37 may be arranged in rows as shown in FIG. 9, and then can be worked simultaneously with two or more wire arrays 33. Alternatively, a workpiece 37 that is long enough to yield several channel fin assemblies may be subjected to working process for making grooves with the wire saw, and then can be cut at suitable intervals to obtain the individual channel fin assemblies. This process requires that the heat dissipating plates 26a be prevented from deforming during the machining of the workpiece.

Next, a method of forming pin fins by means of a wire saw will be described.

Figure 1A:
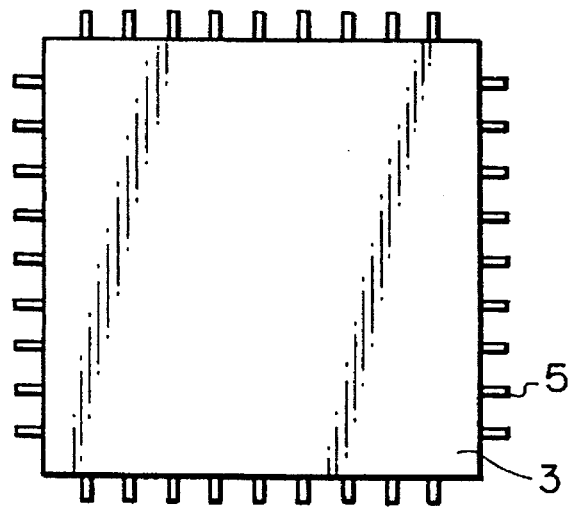
FIG. 1A is a planar view of a ceramic IC package and FIG. 1B is a crossectional view of the package.
Figure 1B:
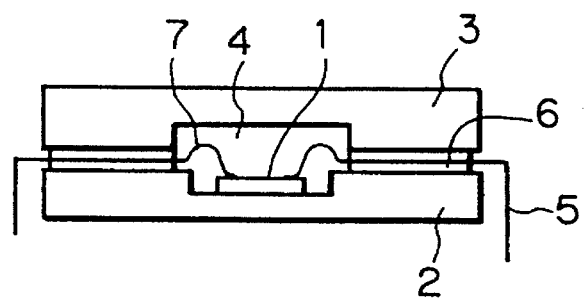
Figure 2:
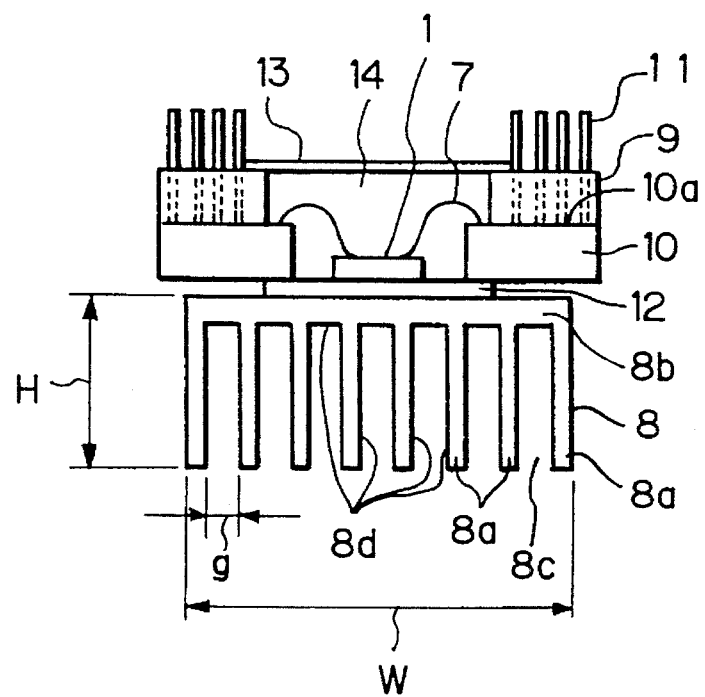
FIG. 2 is an illustration of a heat sink fin mounted on a ceramic IC package of the pin grid array type.
Figure 3A:
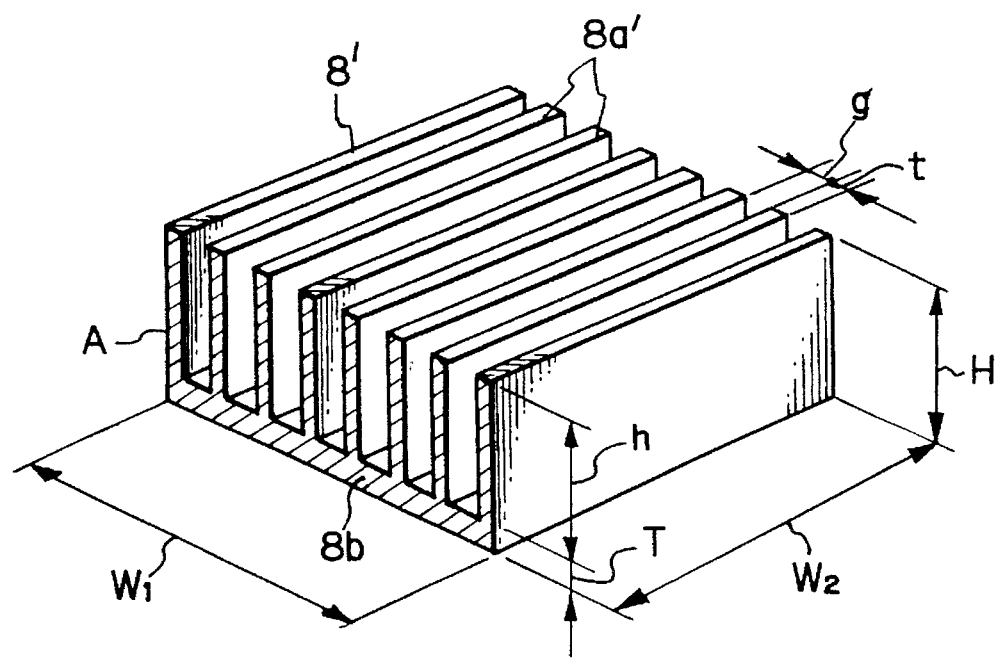
FIG. 3A is a perspective view of a channel heat sink fin.
Figure 3B:
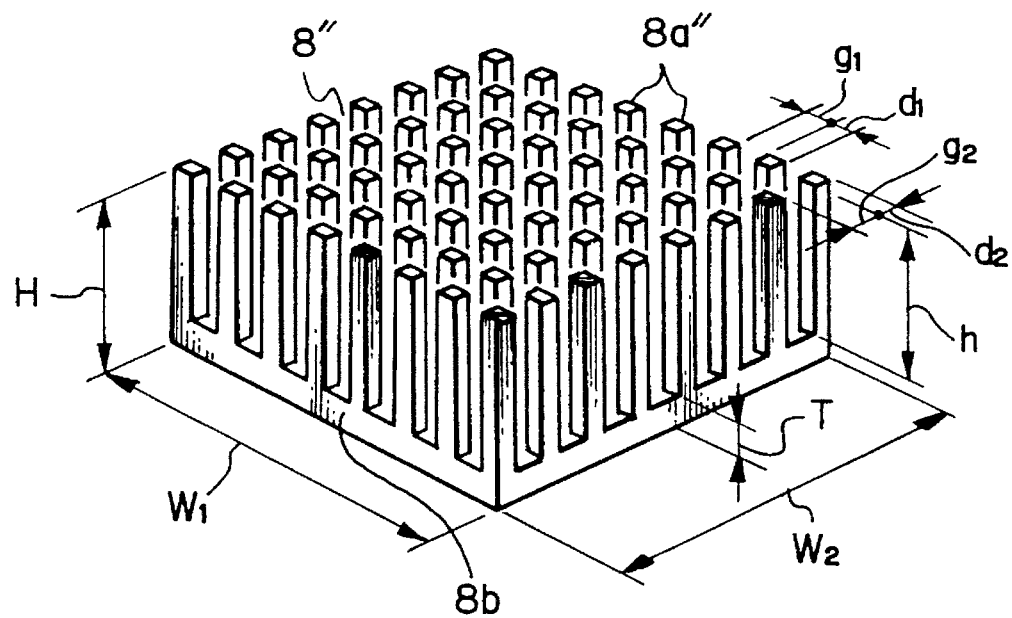
FIG. 3B. is a perspective view of a pin heat sink fin.
Figure 4:
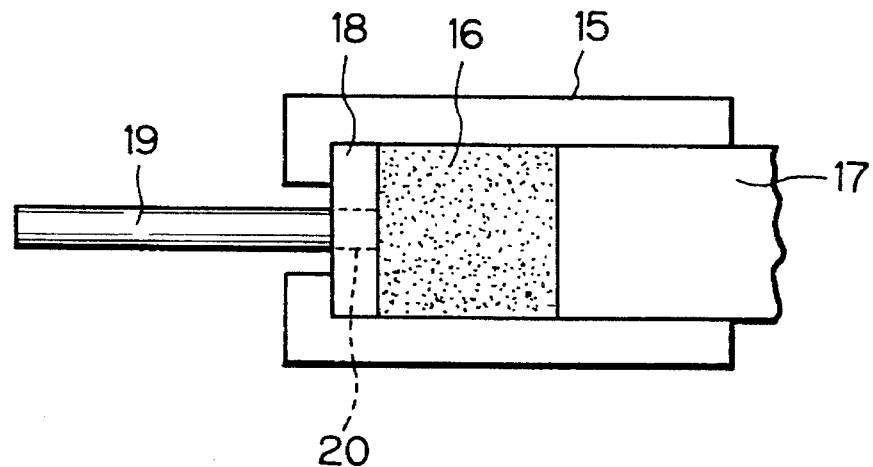
FIG. 4 is an illustration of a working process by extrusion.
Figure 5:
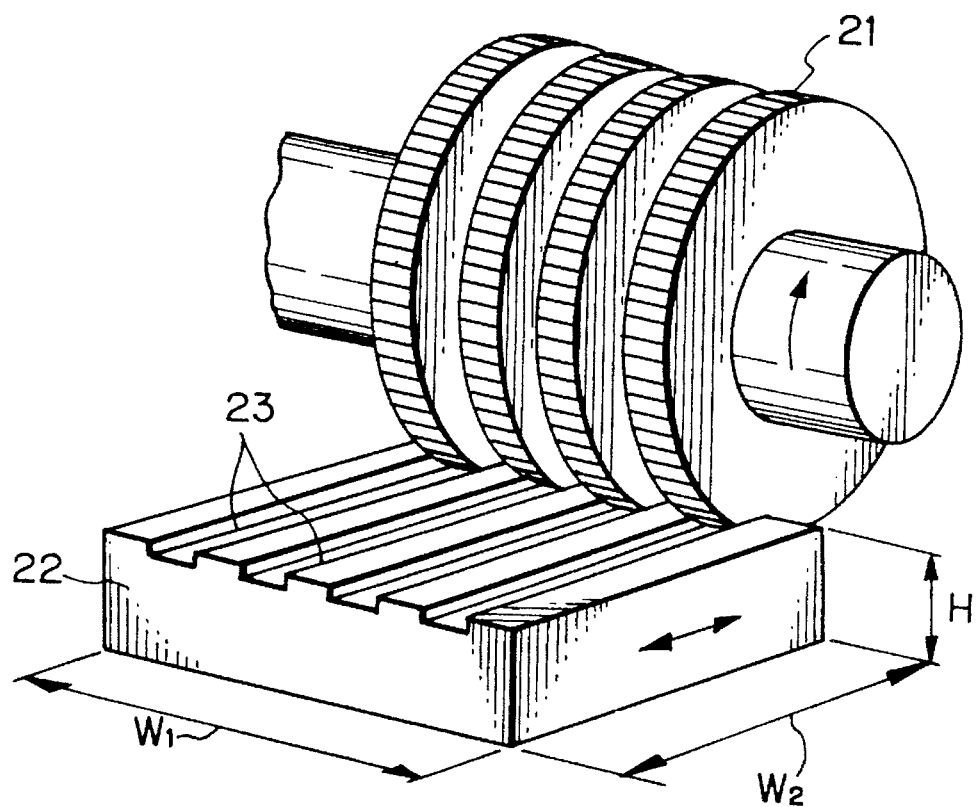
FIG. 5 is an illustration of a working process by milling.

FIGS. 10A, 10B, 10C and 10D are a planar view, an enlarged planar view, a side view, and an enlarged side view, respectively, of a pin fin generally indicated by 30 that is to be produced by the process of the present invention. As already mentioned, the pin heat sink fin 30 is characterized in that the planar dimensions $t_1 \times t_2$ of heat dissipating pins 30a can be made smaller than in the prior art, i.e., smaller than those shown in FIGS. 4 and 5. However, if $t_1$ and $t_2$ are extremely small, the heat dissipating pins 30a might occasionally bend during working, so the minimum practical value is about 0.2 mm for both $t_1$ and $t_2$. If $t_1$ and $t_2$ are small, the heat dissipating pins 30a can potentially deform during the handling of the pin fin assembly 30. To avoid this problem, heat dissipating pins 30b having larger planar dimensions of $w_1 \times w_2$ are preferably provided at the four corners of the fin, whereas heat dissipating pins 30f and 30g of planar dimensions of $t_1 \times w_2$ and $t_2 \times w_1$, respectively, are preferably provided on the four sides of the fin. Preferably, $w_1$ and $w_2$ are in the range of from about 1 to about 2 mm. Needless to say, all of the heat dissipating pins may be designed to have the same thickness ($w_1 = t_1$ and $w_2 = t_2$).

Figure 11A:
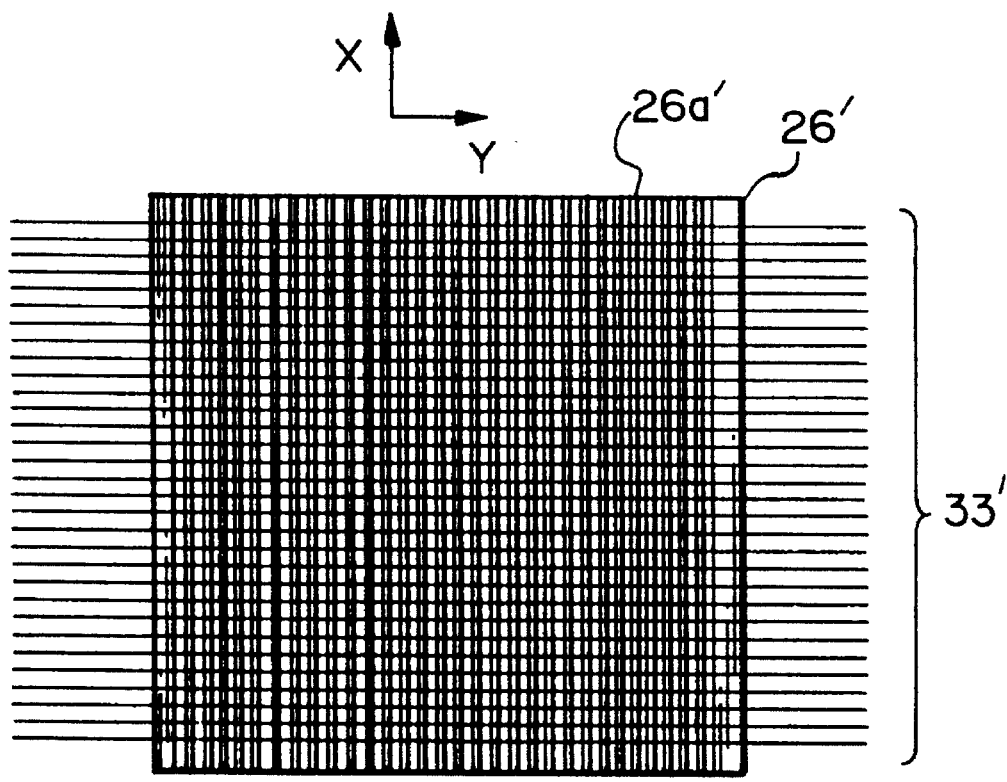
FIG. 11A is a plan view illustrating the relative positions of a workpiece and wires that are used in producing a pin heat sink fin by a two-stage working process.
Figure 11B:
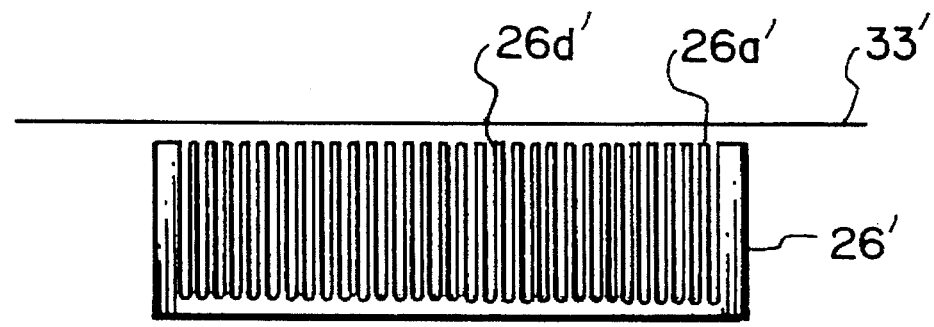
FIG. 11B is a side view of FIG. 11A.

A block of material having the same outside dimensions as those of the pin fin 30 ($W_1 \times W_2 \times H$) shown in FIGS. 10A–10D is used as a workpiece 37, and by applying the above-described method of working channel plates, grooves are formed in the X-direction as seen in FIG. 10, thereby yielding a semifinished product 26' having unidirectional grooves (see FIGS. 11A, 11B). Then, grooving is performed in the Y-direction using a wire array 33' that crosses preferably at right angles, the grooves formed in the surface of the semifinished product 26' in the X-direction (also see FIGS. 11A, 11B), whereby a pin fin 30 is produced (see FIG. 10A). In the production of the pin fin assembly 30, grooving is preferably performed in the Y-direction with abrasive slurry remaining in the grooves 26d' in the surface of the semifinished product 26' because the abrasive powder is effective in preventing the walls 26a' of those grooves from deforming. As in the working of channel fins, it is also possible in the working of a pin fin 30 with the wire saw for a plurality of workpieces 37 to be arranged in a plane and subjected to cutting in the X- and Y-directions. This method is effective in shortening the working time per workpiece.

Figure 12A:
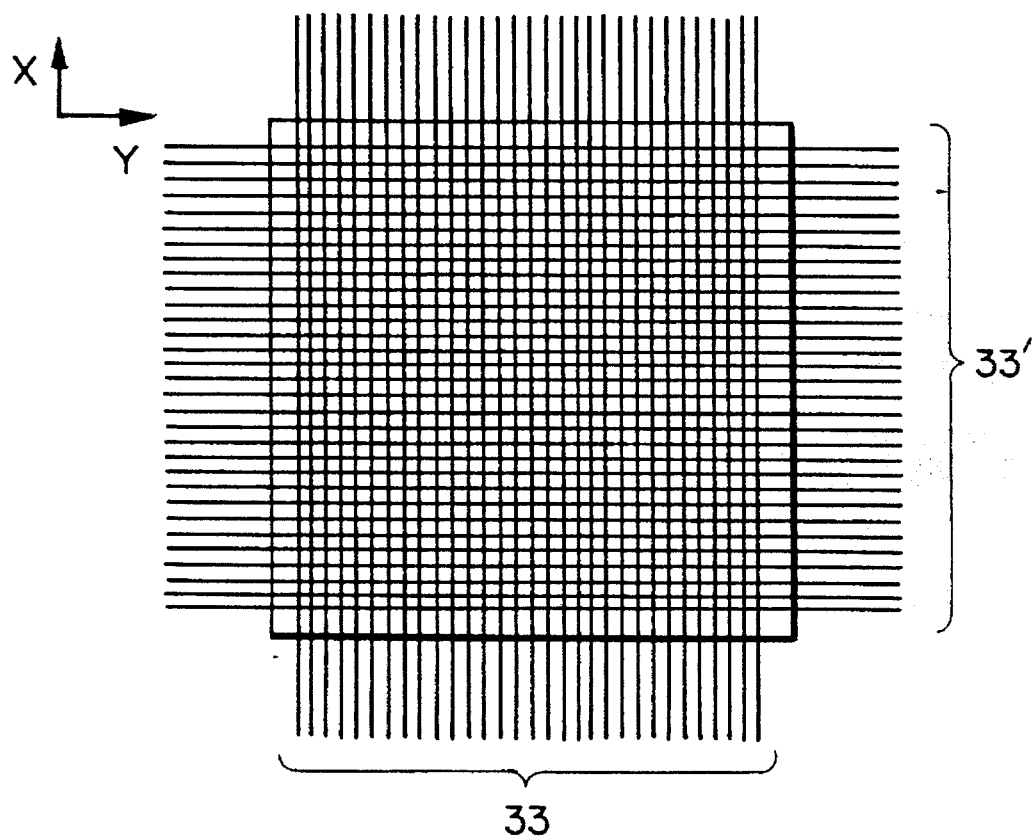
FIG. 12A is a plan view illustrating the relative positions of a workpiece and wires that are used in producing a pin heat sink fin by means of wire rows positioned in two crossed directions.
Figure 12B:
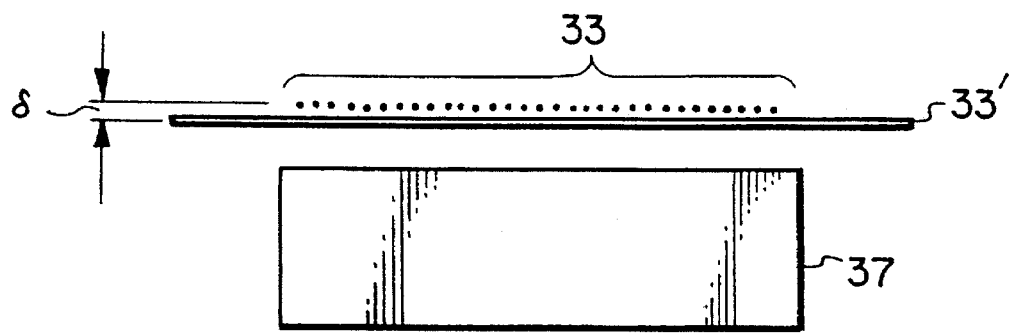
FIG. 12B is a side view of FIG. 12A.

The foregoing method permits grooving to be performed in the X-direction independently of grooving in the Y-direction. If desired, the two grooving operations may be performed simultaneously as shown in FIGS. 12A and 12B, which are respectively a planar view and a side view. As shown in FIG. 12A, a wire array 33 that extends in the X-direction with respect to the workpiece 37 and a wire array 33' that extends in the Y-direction are set in such a way that they cross each other, preferably at right angles. The two wire arrays 33 and 33' are stretched with a slight level difference δ therebetween as shown in FIG. 12B. As a result, a difference is created between the depth of grooves formed by wire array 33 and the depth of grooves formed by wire array 33'. However, this difference will cause no problems for practical purposes since δ can be set to a value not exceeding about 0.5 mm.

The wire saw to be used in the present invention may be selected from among known types and the material of the wire, the abrasive powder and other factors are not limited in any particular way and may be selected as appropriate for the material of the workpiece.

Examples

Examples of the present invention are described below.

(Example 1)

Sixty-four workpieces each having planar dimensions of 28.2 mm×28.2 mm were cut from a hot-rolled pure aluminum plate having a thickness of 20 mm. These workpieces were placed in intimate contact with one another to form a square consisting of 8 pieces on each side and fixed to a base by means of an adhesive. Eight wire arrays each having a piano wire with a diameter of 0.7 mm stretched on a pitch of 1.1 mm were placed just above the eight individual rows of workpieces, and the wires were run at a speed of 400 m per minute. While an abrasive slurry that contained abrasive powder (#600 GC) in a lapping oil was applied over the wire arrays, the workpieces were lifted at a speed of 0.2 mm per minute so that they were urged against the wire arrays to form grooves having a depth of 19 mm. As a result, a channel fin was produced. Each fin had a thick (0.5 mm) heat dissipating plate on both sides, with a row of 24 parallel, thinner heat dissipating plates (0.3 mm) being provided at spacings of 0.8 mm. The bottom plate portion of each fin had a thickness of 1 mm.

The channel fin thus produced was subjected to an experiment in a wind tunnel under varying heat generation and air velocity conditions. With heat generated in quantities of 5–10 W and air blowing at velocities of 1.0–1.5 m/sec, the heat resistance was generally in the range of 2.5°–2.1° C./W, demonstrating the remarkable cooling performance of the channel fin assemblies tested.

(Example 2)

Thirty-six workpieces were prepared by quenching and tempering corrosion-resistant aluminum alloys each having planar dimensions of 39.5 mm×39.5 mm and a thickness of 20 mm. As in Example 1, these workpieces were placed in intimate contact with one another to form a square consisting of 6 pieces on each side and fixed to a base by means of an adhesive. Six wire arrays each consisting of a piano wire with a diameter of 0.9 mm stretched on a pitch of 1.5 mm to form 26 rows were placed just above the six individual rows of workpieces, and the wires were run at a speed of 600 m per minute. Abrasive slurry containing abrasive powder (#600 GC) in a lapping oil was applied over the wire arrays, the workpieces were lifted at a speed of 0.3 mm per minute so that they were urged against the wire arrays to form grooves having a depth of 19 mm. As a result, channel fin were produced. Each fin contained a row of 27 parallel heat dissipating plates 0.5 mm thick that were spaced apart by gaps of 1.0 mm. The bottom plate portion of each fin had a thickness of 1 mm.

The channel heat sink fin thus produced was subjected to an experiment in a wind tunnel under varying heat generation and air velocity conditions. With heat generated in quantities of 5–15 W and air blowing at velocities of 1.0–1.5 m/sec, the heat resistance was generally in the range of 2.2°–1.8° C./W, demonstrating the remarkable cooling performance of the channel fin tested.

(Example 3)

One hundred workpieces were prepared by annealing high-strength aluminum alloys each having planar dimensions of 19.7 mm×19.7 mm and a thickness of 15 mm. As in Example 1, these workpieces were placed in intimate contact with one another to form a square consisting of 10 pieces on each side and fixed to a base by means of an adhesive. Ten wire arrays each consisting of a piano wire with a diameter of 0.6 mm stretched into 18 rows with a pitch of 1.0 mm were placed just above the ten individual rows of workpieces, and the wires were run at a speed of 400 m per minute. As an abrasive slurry that contained abrasive powder (#600 GC) in a lapping oil was applied over the wire arrays, the workpieces were lifted at a speed of 0.2 mm per minute so that they were urged against the wire arrays to form groove having a depth of 14 mm. Thereafter, the entire square of 100 workpieces was rotated 90° in the same plane and subjected to the same procedure of grinding operation, whereby finished products were obtained, each of which contained a heat dissipating pin of 1.0 mm×1.0 mm at the four corners and a total of 68 heat dissipating pins on the four sides, each pin having planar dimensions of 0.3 mm× 1.0 mm, with 289 (17×17) heat dissipating pins of 0.3 mm× 0.3 mm being aligned at spacings of 0.7 mm in the area surrounded by the four corner pins and 68 side pins. The bottom plate portion of each of the finished products had a thickness of 1 mm. These finished products were quenched to yield pin fins.

The pin fin thus produced was subjected to an experiment in a wind tunnel under varying heat generation and air velocity conditions. With heat generated in quantities of 5–10 W and air blowing at velocities of 1.0–1.5 m/sec, the heat resistance was generally in the range of 1.8°–1.5° C./W, demonstrating the remarkable cooling performance of the pin fin tested.

(Example 4)

One hundred workpieces were prepared by annealing corrosion-resistant aluminum alloys each having planar dimensions of 14.3 mm×14.3 mm and a thickness of 15 mm. As in Example 1, these workpieces were placed in intimate contact with one another to form a square consisting of 10 pieces on each side and fixed to a base by means of an adhesive. Twenty wire arrays each consisting of a piano wire with a diameter of 0.5 mm spaced apart on a pitch of 0.9 mm to form 18 rows were disposed in such a way that one half (10) of the wire arrays crossed the other half with a level difference of 0.5 mm being provided and with the intersections of wire arrays being placed just above each workpiece. As the wires in the arrays were run a speed of 400 m per minute, an abrasive slurry that contained abrasive powder (#600 GC) in a lapping oil was applied over the wire arrays while the workpieces were lifted at a speed of 0.2 mm per minute so that they were urged against the wire arrays to form grooves having a depth of 14 mm by the action of the lower wire rows. As a result, pin fins were produced, each of which contained a heat dissipating pin of 1.0 mm×1.0 mm at the four corners and a total of 52 heat dissipating pins on the four sides, each pin having planar dimensions of 0.3 mm×1.0 mm, with 169 (13×13) heat dissipating pins of 0.3 mm×0.3 mm being aligned at spacings of 0.6 mm in the area surrounded by the four corner pins and 52 side pins.

The pin heat sink fin thus produced was subjected to an experiment in a wind tunnel under varying heat generation and air velocity conditions. With heat generated in quantities of 5–10 W and air blowing at velocities of 1.0–1.5 m/sec, the heat resistance was generally in the range of 2.0°–1.7° C./W, demonstrating the remarkable cooling performance of the pin fin tested.

As described on the foregoing pages, the methods of the present invention have the advantage that the thickness of heat dissipating plates in a channel fin or the thickness of heat dissipating pins in a pin fin can be made much smaller than has been possible in the prior art. Hence, given a heat fin assembly of the same planar dimensions, the number of heat dissipating plates or pins that can be provided is so much increased as to achieve a marked improvement in the thermal-dissipation performance of the fin assembly. In addition, the methods of the present invention rely upon grinding with a wire saw employing free grit particles. Hence, they are applicable not only to metallic materials of low ductility which are difficult to work by plastic deformation, but also to materials of high hardness which are difficult to work by cutting processes. Thus, the methods of the present invention offer the additional advantage of increasing the latitude in selection of the constituent material of a heat fin.

If the present invention is to be applied to a heat sink fin for use with IC packages, the improvement achieved in thermal-dissipation performance makes it possible to reduce the dimensions of the heat sink fin itself, thereby contributing to the fabrication of smaller electronic devices. In addition, further increases in the integration of IC chips can be achieved without increasing the size of fin. Thus, the present invention is sure to make a great contribution to the development of the electronics industry.

What is claimed is:

1. A heat sink fin comprising a bottom plate mounted on an IC package and a plurality of heat dissipating plates integrally formed with and extending in parallel from the bottom plate, the heat dissipating plates each having a thickness t of no more than 1 mm and being spaced apart by a gap g of no more than 1.5 mm, the heat dissipating plates having a height h wherein h/t is not less than 20 and h/g is not less than 19.

2. A heat sink fin according to claim 1 wherein the heat dissipating plates are formed by means of a multi-wire saw.

3. A heat sink fin according to claim 1 wherein the heat dissipating plates comprise end plates disposed at ends of the heat sink fin and inner plates disposed between the end plates and having a smaller thickness than the end plates.

4. A heat sink fin according to claim 1 wherein the fin is made of an aluminum alloy.

5. A heat sink fin according to claim 1 wherein the bottom plate has four sides at right angles to each other, the heat dissipating plates along each of the four sides being thicker than a remainder of the heat dissipating plates.

6. A heat sink fin according to claim 1 wherein the bottom plate is in direct contact with the IC package.

7. A heat sink fin according to claim 1 wherein the bottom plate is a solid metal plate wherein the heat dissipating plates comprise portions of the solid metal plate formed by wire sawing.

8. A heat sink fin according to claim 1 wherein the bottom plate is mounted to the IC package such that heat from an IC chip of the IC package flows directly into the bottom plate and then into the heat dissipating plates.

9. A heat sink fin comprising a monolithic combination of a bottom plate mounted on an IC package and a plurality of heat dissipating pins arranged in an array and extending from the bottom plate, the heat dissipating pins each having a thickness t, planar dimensions of no more than 1 mm× 1 mm and being spaced apart by a gap g of no more than 1.5 mm, the heat dissipating pins having a height h wherein h/t is not less than 20 and h/g is not less than 19.

10. A heat sink fin according to claim 9 wherein the heat dissipating pins are formed by means of a multi-wire saw.

11. A heat sink fin according to claim 9 wherein the heat dissipating pins at the four corners and/or on the four sides are thicker than the other heat dissipating pins positioned inward.

12. A heat sink fin according to claim 9 wherein the fin is made of an aluminum alloy.

13. A heat sink fin according to claim 9 wherein the bottom plate has four sides at right angles to each other, the heat dissipating pins along each of the four sides being thicker than a remainder of the heat dissipating pins.

14. A heat sink fin according to claim 9 wherein the bottom plate is in direct contact with the IC package.

15. A heat sink fin according to claim 9 wherein the bottom plate is a solid metal plate wherein the heat dissipating pins comprise portions of the solid metal plate formed by wire sawing.

16. A heat sink fin according to claim 9 wherein the bottom plate is mounted to the IC package such that heat from an IC chip of the IC package flows directly into the bottom plate and then via a heat conducting plate into the heat dissipating pins.

17. A heat sink fin comprising a bottom plate mounted on an IC package and a plurality of heat dissipating plates integrally formed with and extending in parallel from the bottom plate, the heat dissipating plates each having a thickness t of no more than 1 mm and being spaced apart by a gap g of no more than 1.5 mm, the heat dissipating plates having a height h wherein h/t is not less than 20 and h/g is not less than 15.

18. A heat sink fin comprising a monolithic combination of a bottom plate mounted on an IC package and a plurality of heat dissipating pins arranged in an array and extending from the bottom plate, the heat dissipating pins each having a thickness t, planar dimensions of no more than 1 mm×1 mm and being spaced apart by a gap g of no more than 1.5 mm, the heat dissipating pins having a height h wherein h/t is not less than 20 and h/g is not less than 15.

* * * * *